(12) United States Patent
Hsu et al.

(10) Patent No.: US 7,452,754 B2
(45) Date of Patent: Nov. 18, 2008

(54) METHOD FOR MANUFACTURING FLEXIBLE PRINTED CIRCUIT BOARDS

(75) Inventors: Chia-Shuo Hsu, Tayuan (TW); Fu-Sing Huang, Tayuan (TW); Chao-Ching Wang, Tayuan (TW)

(73) Assignee: Foxconn Advanced Technology Inc., Tayuan, Taoyuan (TW)

( * ) Notice: Subject to any disclaimer, the term of this patent is extended or adjusted under 35 U.S.C. 154(b) by 94 days.

(21) Appl. No.: 11/309,364

(22) Filed: Aug. 1, 2006

(65) Prior Publication Data
US 2007/0077688 A1    Apr. 5, 2007

(30) Foreign Application Priority Data
Sep. 16, 2005    (TW) ................................ 094132090

(51) Int. Cl.
*H01L 21/00* (2006.01)

(52) U.S. Cl. ........................ 438/118; 438/106; 257/685; 257/686; 257/687; 257/688; 257/E23.055; 257/E23.177

(58) Field of Classification Search ................. 438/106, 438/118, 119; 257/685–688, E23.055, E23.177; 174/250–268
See application file for complete search history.

(56) References Cited

U.S. PATENT DOCUMENTS

| | | | | |
|---|---|---|---|---|
| 5,436,062 A | * | 7/1995 | Schmidt et al. | 428/209 |
| 5,738,931 A | * | 4/1998 | Sato et al. | 428/209 |
| 6,797,367 B2 | * | 9/2004 | Ogawa et al. | 428/209 |
| 2004/0178492 A1 | * | 9/2004 | Tsukamoto et al. | 257/690 |
| 2006/0008759 A1 | * | 1/2006 | Shiozawa | 432/121 |
| 2006/0013970 A1 | * | 1/2006 | Wada | 428/32.24 |
| 2006/0060944 A1 | * | 3/2006 | Shintate et al. | 257/622 |
| 2006/0068573 A1 | * | 3/2006 | Shintate et al. | 438/584 |
| 2006/0087545 A1 | * | 4/2006 | Sakurada et al. | 347/104 |
| 2006/0096701 A1 | * | 5/2006 | Shiozawa | 156/250 |

FOREIGN PATENT DOCUMENTS

CN    1264270 A    8/2000

* cited by examiner

*Primary Examiner*—George Fourson
*Assistant Examiner*—John M Parker
(74) *Attorney, Agent, or Firm*—Andrew C. Cheng

(57) ABSTRACT

A method for manufacturing of flexible printed circuit boards is provided. The method includes the steps of: providing a tape substrate having an electrically insulating layer and an electrically conducting layer; forming a wiring pattern at the electrically conducting layer; attaching a back film on a surface of the tape substrate; and cutting the tape substrate to get a number of flexible printed circuit boards attached on the back film.

20 Claims, 4 Drawing Sheets

METHOD FOR MANUFACTURING FLEXIBLE PRINTED CIRCUIT BOARDS

FIELD OF THE INVENTION

The present invention generally relates to methods for manufacturing flexible printed circuit boards, and more particularly to a method for roll-to-roll manufacturing flexible printed circuit boards.

DESCRIPTION OF RELATED ART

A typical base sheet for a flexible printed circuit board is a multiple-layered laminated sheet including a number of electrically insulating films and a number of metal foils, adhesively bonded to one surface of the electrically insulating films either directly or via an adhesive layer sandwiched therebetween. The electrically insulating film may be a plastic resin. The metal foil may be a copper foil. A flexible printed circuit board is prepared by patterning the metal foils into a required pattern of a desired electric wiring circuit.

Flexible printed circuit boards are generally formed by an etching or a plating process in a similar manner to the preparation of rigid printed circuit boards. However, flexible printed circuit boards have the advantage that preparation treatments can be conducted continuously. That is to say, the preparation of the flexible printed circuit board can be made by a roll-to-roll operation, but not a piece by piece operation as in the case of the rigid printed circuit board where the board is treated in the form of discrete sheets. Continuous preparation can greatly reduce the manufacturing cost of the printed circuit board. However, in the roll-to-roll system, the flexible printed circuit board is usually rolled up to a reel directly, which may introduce much abrasion to the flexible printed circuit board.

Therefore, it is desired to provide an improved method for manufacturing flexible printed circuit boards that overcomes the above-described problems.

SUMMARY OF THE INVENTION

A method for manufacturing flexible printed circuit boards is provided. The method includes the steps of: providing a tape substrate having an electrically insulating layer and an electrically conducting layer; forming a wiring pattern at the electrically conducting layer; attaching a back film on a surface of the tape substrate; and cutting the tape substrate to obtain a number of flexible printed circuit boards attached on the back film.

Advantages and novel features will become more apparent from the following detailed description when taken in conjunction with the accompanying drawing.

BRIEF DESCRIPTION OF THE DRAWINGS

Many aspects of the present method can be better understood with reference to the following drawings. The components in the drawings are not necessarily drawn to scale, the emphasis instead being placed upon clearly illustrating the principles of the present method. Moreover, in the drawings, like reference numerals designate corresponding parts throughout the several views.

DETAILED DESCRIPTION OF THE INVENTION

A preferred embodiment of the present invention will be explained with reference to drawings. There is provided a method for manufacture of a number of flexible printed circuit boards. The method includes the following steps: firstly, providing a tape substrate having an electrically insulating layer and an electrically conducting layer; secondly, forming a wiring pattern on the electrically conducting layer; thirdly, attaching a back film on a surface of the tape substrate; fourthly, cutting the tape substrate to obtain a number of flexible printed circuit boards attached to the back film.

Figure 1:
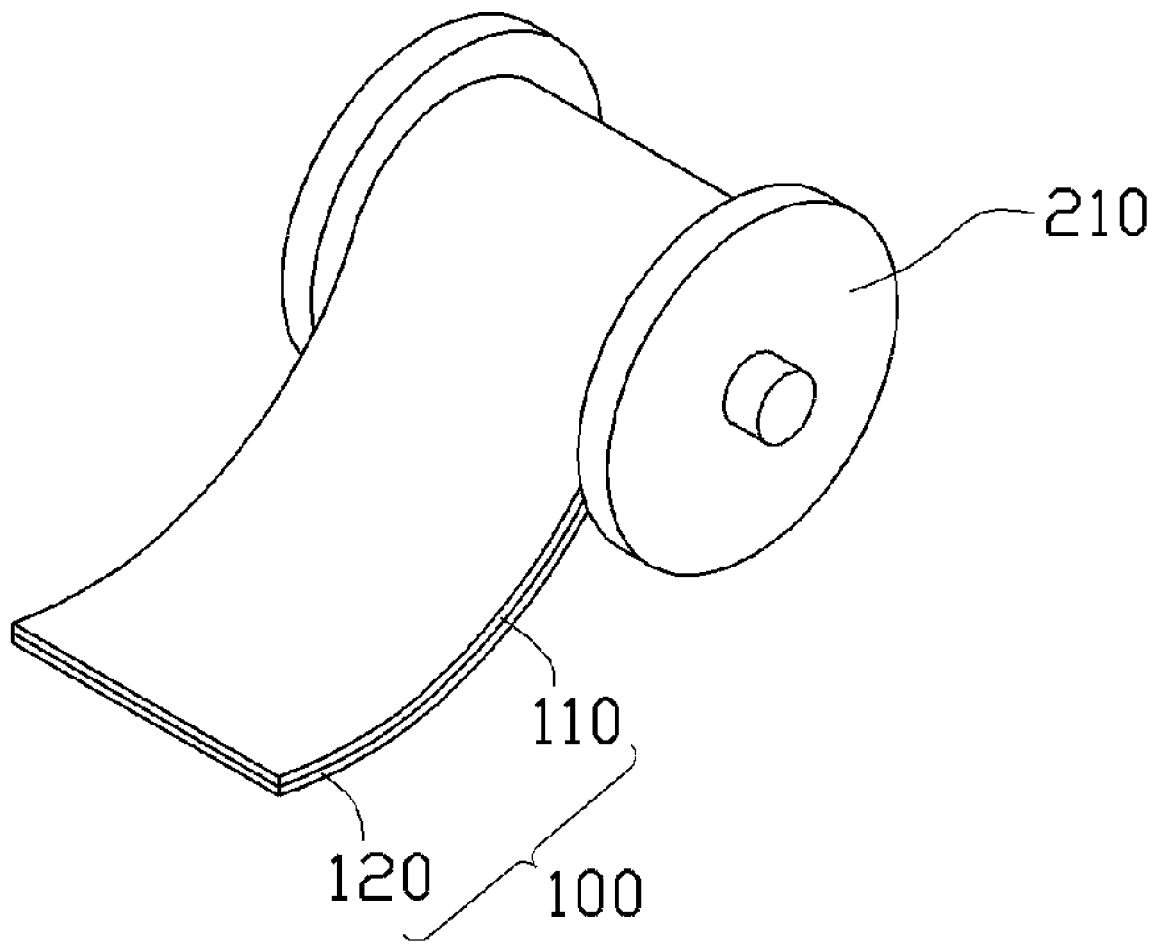
FIG. 1 is a schematic view of a tape substrate rolled out from a first reel, in accordance with a preferred embodiment.

In the first step, a tape substrate is provided. The tape substrate may be composed of an electrically insulating layer and an electrically conductive layer attached on one or two surface of the electrically insulating layer. FIG. 1 shows a tape substrate 100 including an electrically insulating layer 120 with an electrically conductive layer 110 attached on one surface of the electrically insulating layer 120. The electrically insulating layer 120 may be made of polyimide (PI), polyethylene terephalate (PET), liquid crystal polymer (LCP), Teflon (PTFE) or the like. A thickness of the electrically insulating layer 120 is in a range from 10 micrometers to 75 micrometers. The electrically conductive layer 110 may be made of copper (Cu), gold (Au) or any other electrically conductive alloy. A thickness of the electrically conductive layer 110 is in a range from 5 micrometers to 50 micrometers. In the present embodiment, the electrically insulating layer 120 is made of PI and has a thickness of approximately 25 micrometers. The electrically conductive layer 110 is made of copper and has a thickness of approximately 18 micrometers. Since the tape substrate 100 is composed of thin layers of PI layer 120 and thin layers of copper layer 110, the tape substrate 100 is flexible.

Figure 2:
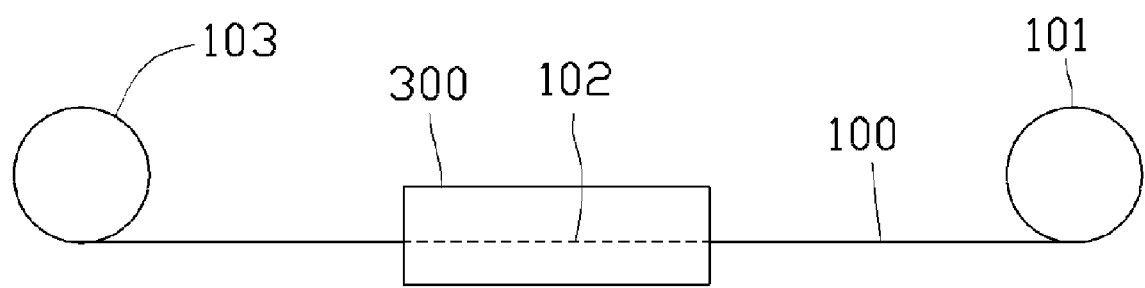
FIG. 2 is a side view schematically illustrating the roll-to-roll technique.

In the second step, a number of wiring patterns are formed on the tape substrate 100. Since the aforementioned tape substrate 100 is flexible, wiring patterns can be mass-produced on the tape substrate 100 by a roll-to-roll operation in continuous fashion. As shown in FIG. 2, the tape substrate 100 has a first portion 101 wrapped into a reel. The first portion 101 of the tape substrate 100 is continuously unwrapped and transferred into an intermediate portion 102, and the intermediate portion 102 passes through a treating device 300 for defining a number of wiring patterns thereon. The intermediate portion 102, with the wiring patterns thereon, is then transferred into a second portion 103 and is re-wrapped into another reel. This method is advantageous in having a high efficiency of production due to its continuous operation. Since the unwinding and rewinding of the tape substrate 100 is performed in this method, the tape substrate 100 to be employed herein is required to be flexible to a prescribed degree.

Details of the treating process for defining the wiring patterns will be explained in the following. In the present embodiment, the wiring patterns are defined in the copper layer 110. Because the copper layer 110 may be exposed to the air, a surface of the copper layer 110 of the tape substrate 100 is possible to be oxidized or polluted. Thus, it is preferred that the copper layer 110 is pretreated before the forming of the wiring patterns. The oxidized surface of the copper layer 110 can be treated with an acid solution, an alkaline solution or other cleaning agent if necessary.

The wiring patterns can be made by an etching process with a dry film photoresist or a wet film photoresist. The etching process includes the following steps: firstly, forming a photoresist on at least one surface of the copper layer 110. Secondly, exposing the photoresist with a photomask having a desired pattern. The parts of the photomask which undergo exposure become dissoluble, while residual portions of the photoresist form needed patterns. Thirdly, developing with a developing agent to remove the dissoluble portions of the photoresist, while the residual portions of the photoresist covering the copper layer 110 can protect the copper layer 110 from corrosion. Fourthly, etching the uncovered portions of the copper layer 110, then the residual portions of the copper layer 110 covered with the photoresist form a desired wiring pattern. Finally, removing the residual portions of the photoresist with an alkaline solution, an acid solution or other solutions as necessary. Thus the desired wiring pattern is obtained.

Figure 3:
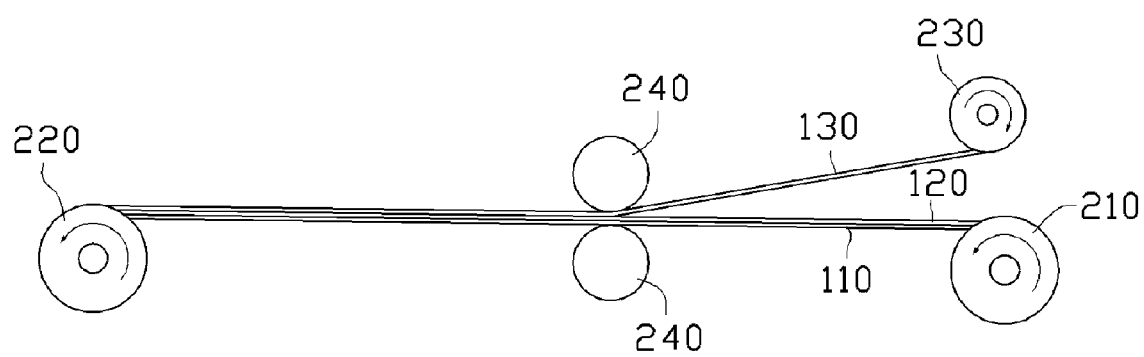
FIG. 3 is a schematic view of a back film attached on the tape employing the roll-to-roll technique.

Referring to FIG. 3, in the third step, a back film 130 is attached on one surface of the tape substrate 100 by the roll-to-roll operation in a continuous manner. Since the back film 130 is provided for supporting and protecting the tape substrate 100, the back film 130 can be formed either on the PI layer 120 or on the copper layer 110 (i.e., the wiring pattern). In the present embodiment, the back film 130 is formed on the PI layer 120. The back film 130 may be made of an adhesive and flexible material, such as polyimide, polyethylene terephalate, liquid crystal polymer, Teflon or the like. In the preferred embodiment, the back film 130 may be made of polyethylene terephalate and is about seventy-five micrometers in thickness.

An example process for attaching the back film 130 on the PI layer 120 is described in the following. As shown in FIG. 3, the tape substrate 100 and the back film 130 are continuously unwrapped from a first reel 210 and a third reel 230 respectively, and pass through a clearance between a pair of rollers 240, thus the back film 130 is pressed and adheres to the tape substrate 100. The tape substrate 100, with the back film 130 adhered thereto, is wrapped around a second reel 220.

Figure 4:
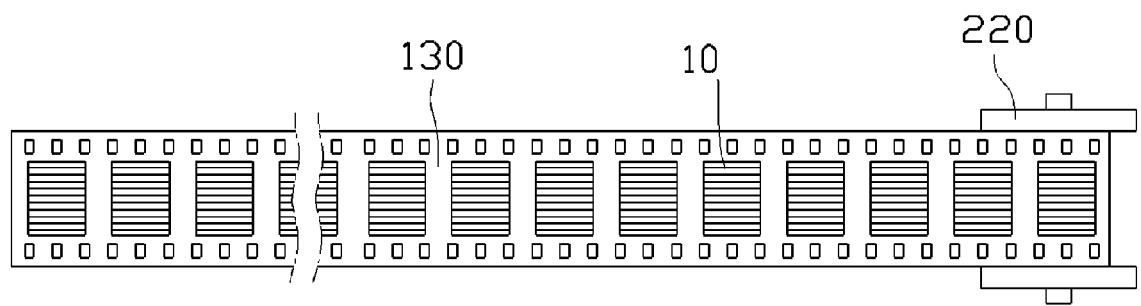
FIG. 4 is a schematic view of a number of flexible printed circuit boards attached on the back film.

In the fourth step, a number of flexible printed circuit boards 10 are produced from the tape substrate 100, and the obtained flexible printed circuit boards 10 are attached on the back film 130, as shown in FIG. 4. According to the predetermined dimensions of the flexible printed circuit board 10, a die is provided for forming a desired flexible printed circuit board on the tape substrate 100. Since the tape substrate 100 with the back film 130 attached thereon is flexible, the manufacturing process can be performed by the aforementioned roll-to-roll system. The tape substrate 100 with the back film 130 attached thereon is continuously wrapped from the second reel 220 and is processed by the die for defining a flexible circuit board therein. The tape substrate 100, with the flexible circuit board defined thereon, is then wrapped.

The back film 130 is utilized to support the flexible tape substrate. During the forming of the flexible printed circuit boards 10, a processing depth can be controlled. That is, the tape substrate 100 can be substantially processed, while the back film 130 is not touched or scratched. In addition, a lot of the tape substrate leavings which may easily to jam the roll-to-roll system may be produced in a conventional method. However, in the present embodiment, the leavings are adhered on the back film 130, thus ensuring the continuity of the roll-to-roll process. Finally, the leavings are peeled off.

Alternatively, the third step can be performed before the second step, that is, the back film can be attached on the tape substrate 100 before forming the wiring pattern onto the tape substrate 100. Adopting this processing fashion, in the whole manufacturing process, the tape substrate 100 can be protected from scratch or friction.

The above mentioned process may be employed to manufacture double-sided flexible printed circuit boards, that is, the manufactured tape substrate is composed of a PI layer with a first copper layer and a second copper layers separately attached on two opposite side surfaces of the PI layer. The first and second copper layers are configured for forming first and second wiring pattern respectively. The method of manufacturing double-sided flexible printed circuit boards includes the following steps: firstly, attaching a first continuous back film on the surface of the first copper layer; secondly, forming the second wiring pattern at the second copper layer; thirdly, attaching a second continuous back film on the second wiring pattern; fourthly, removing the first continuous back film from the first copper layer; fifthly, forming the first wiring pattern at the first copper layer; finally, cutting the tape substrate having the first and second wiring patterns to achieve a number of flexible printed circuit boards attached on the second continuous back film. In the aforementioned process, the continuous back film not only protects the wiring patterns, but also the PI layer leavings which may easily to jam the roll-to-roll system may be attached on the back films. Alternatively, the first and the fourth steps may also be omitted.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A method for manufacturing flexible printed circuit boards, the method comprising:
   providing a tape substrate having an electrically insulating layer and an electrically conducting layer;
   forming a plurality of flexible printed circuit boards in the tape substrate;
   attaching a continuous back film on a surface of the tape substrate; and
   cutting the tape substrate to separate the plurality of flexible printed circuit boards, each of the separated flexible printed circuit boards being attached on a same surface of the continuous back film.

2. The method as claimed in claim 1, wherein the continuous back film is pressed on the surface of the electrically insulating layer.

3. The method as claimed in claim 1, wherein the continuous back film is pressed on a surface of the tape substrate on which the plurality of flexible printed circuit boards is formed.

4. The method as claimed in claim 1, wherein a thickness of the electrically conducting layer is in the range from 5 micrometers to 50 micrometers.

5. The method as claimed in claim 1, wherein the continuous back film is made of polyimide, polyethylene terephalate, liquid crystal polymer or Teflon.

6. The method as claimed in claim 1, wherein a thickness of the continuous back film is 75 micrometers.

7. The method as claimed in claim 1, wherein the continuous back film is attached on the electrically insulating layer of the tape substrate.

8. The method as claimed in claim 1, wherein the continuous back film is attached on the electrically conducting layer with the plurality of flexible printed circuit boards formed thereat.

9. The method as claimed in claim 8, wherein the tape substrate further comprises another electrically conducting layer cooperating with the electrically conducting layer to sandwich the electrically insulating layer therebetween, and the method further comprises forming another plurality of flexible printed circuit boards at the another electrically conducting layer.

10. The method as claimed in claim 9, further comprising:
attaching another continuous back film on the another electrically conducting layer before forming the plurality of flexible printed circuit boards at the electrically conducting layer; and
removing the another continuous back film before forming the another plurality of flexible printed circuit boards at the another electrically conducting layer.

11. A method fix manufacturing flexible printed circuit boards, said method comprising the following steps:
providing a substrate comprising an electrically insulating layer and an electrically conducting layer;
transferring the substrate between a pair of reels and attaching a continuous back film on the substrate when the substrate is transferred;
transferring the substrate with the continuous back film attached thereon using a roll-to-roll system and forming a plurality of flexible printed circuit boards in the tape substrate when the substrate is transferred; and
cutting the substrate to separate the flexible printed circuit boards, each of separated flexible printed circuit boards being attached on a same surface of the continuous back film.

12. The method as claimed in claim 11, wherein the substrate is cut via a die.

13. The method as claimed in claim 11, wherein leavings formed in the cutting process are adhered to the back film.

14. The method as claimed in claim 13, further comprising a step of removing the leavings from the back film.

15. The method as claimed in claim 11, wherein the back film is pressed to the substrate via another pair of rolls which presses the back film to the substrate when the back film and the substrate pass through a clearance formed therebetween.

16. The method as claimed in claim 15, wherein the back film and the substrate are wrapped around two different reels before they are pressed together and wrapped around one reel after they are pressed together.

17. A method for manufacturing flexible printed circuit boards, said method comprising the following steps:
providing a substrate comprising an electrically insulating layer and an electrically conducting layer;
transferring the substrate between a pair of reels and forming a plurality of flexible printed circuit boards in the substrate when the substrate is transferred;
transferring the substrate having the plurality of flexible printed circuit boards using a roll-to-roll system and attaching a continuous back film on the electrically insulating layer of the substrate when the substrate is transferred; and cutting the substrate to separate the flexible printed circuit boards, each of separated flexible printed circuit boards being attached on a same surface of the continuous back film.

18. The method as claimed in claim 1, wherein the tape substrate is provided via a reel.

19. The method as claimed in claim 1, wherein the tape substrate is transferred between a pair of reels during formation of the plurality of flexible printed circuit boards in the tape substrate.

20. The method as claimed in claim 1, wherein the tape substrate with the continuous back film formed thereon is transferred using a roll-to-roll system.

* * * * *